(12) United States Patent
Lin et al.

(10) Patent No.: US 10,541,532 B2
(45) Date of Patent: Jan. 21, 2020

(54) TRANSMISSION CIRCUIT FOR ETHERNET DEVICE

(71) Applicant: NLIGHTNING TECHNOLOGY LTD., Zhubei, Hsinchu County (TW)

(72) Inventors: Kun Tsen Lin, Zhubei (TW); Shih Peng Wu, Zhubei (TW)

(73) Assignee: NLIGHTNING TECHNOLOGY LTD., Zhubei, Hsinchu County (TW)

( * ) Notice: Subject to any disclaimer, the term of this patent is extended or adjusted under 35 U.S.C. 154(b) by 458 days.

(21) Appl. No.: 15/622,218

(22) Filed: Jun. 14, 2017

(65) Prior Publication Data
US 2017/0373489 A1 Dec. 28, 2017

(30) Foreign Application Priority Data

Jun. 23, 2016 (TW) .............................. 105209444 U

(51) Int. Cl.
| | |
|---|---|
| *H02H 7/04* | (2006.01) |
| *H02H 9/00* | (2006.01) |
| *H04L 12/00* | (2006.01) |
| *H02H 9/04* | (2006.01) |
| *H03H 7/01* | (2006.01) |
| *H03H 7/38* | (2006.01) |

(52) U.S. Cl.
CPC ............. *H02H 9/005* (2013.01); *H04L 12/00* (2013.01); *H02H 9/041* (2013.01); *H03H 7/0123* (2013.01); *H03H 7/383* (2013.01)

(58) Field of Classification Search
CPC ...... H02H 9/005; H03H 7/0123; H03H 7/383; H04L 12/00
USPC .......................................................... 361/35
See application file for complete search history.

(56) References Cited

U.S. PATENT DOCUMENTS

| | | | | |
|---|---|---|---|---|
| 5,295,058 | A * | 3/1994 | McGreevy .......... | H02M 3/3378 363/134 |
| 6,377,023 | B1 * | 4/2002 | Capel .................... | H02J 7/0018 320/116 |
| 2016/0028225 | A1 * | 1/2016 | Mo ...................... | H04L 25/0264 361/119 |
| 2016/0294347 | A1 * | 10/2016 | Xu ........................ | H03H 7/0115 |

\* cited by examiner

*Primary Examiner* — Thienvu V Tran
*Assistant Examiner* — Lucy M Thomas
(74) *Attorney, Agent, or Firm* — Cantor Colburn LLP

(57) ABSTRACT

A transmission circuit including four transmission component sets for an Ethernet device is provided. Each transmission component set are coupled between an Ethernet connector and an Ethernet chip. Each transmission component set includes a transformer, two capacitors, and four transmission lines (TLs). The transformer includes four terminals and two center taps. Two diagonal terminals of the four terminals are coupled to a ground. The other two diagonal terminals of the four terminals are coupled to the Ethernet connector and, through one of the two capacitors, to the Ethernet chip via two of the four TLs, respectively. The two center taps are coupled to the Ethernet connector and, through the other one of the two capacitors, to the Ethernet chip via the other two of the four TLs, respectively.

14 Claims, 12 Drawing Sheets

TRANSMISSION CIRCUIT FOR ETHERNET DEVICE

CROSS REFERENCE TO RELATED APPLICATION

The present invention claims priority under 35 U.S.C. § 119 to Taiwanese Application No. 105209444 filed on Jun. 23, 2016, including the specification, claims, drawings, and abstract is incorporated herein by reference in its entirety.

BACKGROUND OF THE INVENTION

Field of the Invention

The present invention relates to a transmission circuit for an Ethernet device. More particularly, the transmission circuit of the present invention can replace a transmission circuit used in a traditional Ethernet device to provide signal coupling and direct-current (DC) isolation characteristics necessary for Ethernet transmission and to provide the burst protection function.

Descriptions of the Related Art

With the rapid development of the network science and technologies, Ethernet-related products can be found everywhere in people's daily life. Transmission circuits in Ethernet devices currently available on the market include a number of components such as an LAN transformer, a plurality of resistors and a plurality of capacitors. Among such components, the LAN transformer at least includes a common-mode inductor and a transformer (e.g., the 1000 BASE-T MAGNETICS MODULES manufactured by Bothhand Enterprise Inc.). Therefore, the production cost of the transmission circuit used in the traditional Ethernet device is relatively high.

Accordingly, an urgent need exists in the art to provide a transmission circuit using a fewer number of components and providing the burst protection function to replace transmission circuits used in traditional Ethernet devices.

SUMMARY OF THE INVENTION

An objective of the present invention is to provide a transmission circuit using a fewer number of components and providing the burst protection function to replace transmission circuits used in traditional Ethernet devices.

To achieve the aforesaid objective, the present invention discloses a transmission circuit for an Ethernet device. The transmission circuit comprises four transmission component sets. Each of the transmission component sets is coupled between an Ethernet connector and an Ethernet chip. Each of the transmission component sets comprises a transformer, two capacitors, and four transmission lines. The transformer of each of the transmission component sets comprises four terminals and two center taps. Two diagonal terminals of the four terminals are coupled to a ground. The other two diagonal terminals of the four terminals are coupled to the Ethernet connector and, through one of the two capacitors, to the Ethernet chip via two of the four transmission lines, respectively. The two center taps are coupled to the Ethernet connector and, through the other one of the two capacitors, the Ethernet chip via the other two of the four transmission lines, respectively.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
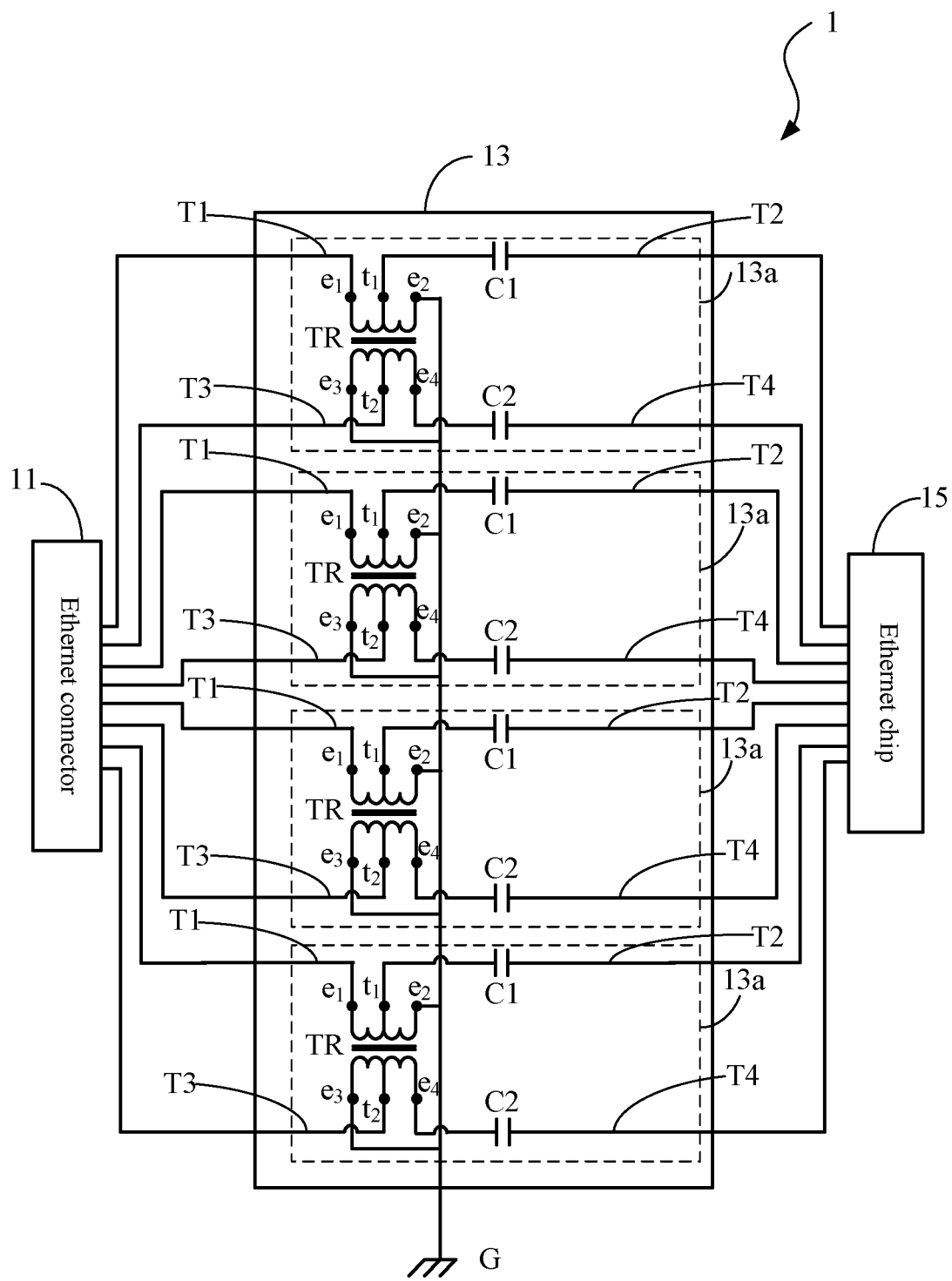
FIG. 1 is a schematic view of an Ethernet application circuit 1 according to a first embodiment of the present invention.

Embodiments described below are intended to illustrate technical contents of the present invention but not to limit the scope of the present invention. It shall be appreciated that, in the following embodiments and the attached drawings, elements not related to the present invention are omitted from depiction, and dimensional relationships among individual elements in the drawings are only provided for ease of understanding but not to limit the actual scale.

A first embodiment of the present invention is shown in FIG. 1, which is a schematic view of an Ethernet application circuit 1 of the present invention. The Ethernet application circuit 1 is a part of an Ethernet device (not shown) and comprises an Ethernet connector 11, a transmission circuit 13 and an Ethernet chip 15.

The Ethernet connector 11 may be an Ethernet connector having an RJ-45 interface, and comprises a Tx0+ pin, a Tx0− pin, a Tx1+ pin, a Tx1− pin, a Tx2+ pin, a Tx2− pin, a Tx3+ pin and a Tx3− pin. The Ethernet chip 15 may be a chip from one of various manufacturers, e.g., an RTL8201 chip from Realtek Semiconductor Co., which comprises an MD0+ pin, an MD0− pin, an MD1+ pin, an MD1− pin, an MD2+ pin, an MD2− pin, an MD3+ pin and an MD3− pin. Because the primary technical content of the present invention focuses on the transmission circuit 13 and how the transmission circuit 13 of the present invention is coupled between the Ethernet connector 11 and the Ethernet chip 15 in place of a transmission circuit used in a traditional Ethernet application circuits can be readily appreciated by those of ordinary skill in the art according to the following description, the Ethernet connector 11 and the Ethernet chip 15 will not be further described herein.

The transmission circuit 13 comprises four transmission component sets 13a. Each of the transmission component sets 13a is coupled between the Ethernet connector 11 and the Ethernet chip 15. Each of the transmission component sets 13a comprises two capacitors C1, C2, a transformer TR and four transmission lines T1, T2, T3, T4.

The transformer TR comprises four terminals $e_1$, $e_2$, $e_3$, $e_4$ and two center taps $t_1$, $t_2$. In this embodiment, two diagonal terminals $e_2$, $e_3$ of the four terminals $e_1$, $e_2$, $e_3$, $e_4$ are coupled to a ground G. The other two diagonal terminals $e_1$, $e_4$ of the four terminals $e_1$, $e_2$, $e_3$, $e_4$ are coupled to the Ethernet connector 11 and, through the capacitor C2, to the Ethernet chip 15 via the transmission lines T1, T4 respectively. As shown in FIG. 1, the terminal $e_1$ is coupled to the Ethernet connector 11 via the transmission line T1, and the terminal $e_4$ is coupled to the Ethernet chip 15 through the capacitor C2 and via the transmission line T4.

The two center taps $t_1$, $t_2$ are coupled to the Ethernet connector 11 and, through the capacitor C1, to the Ethernet chip 15 via the transmission lines T2 and T3 respectively. As shown in FIG. 1, the center tap $t_2$ is coupled to the Ethernet connector 11 via the transmission line T3, and the center tap $t_1$ is coupled to the Ethernet chip 15 through the capacitor C1 and via the transmission line T2.

The capacitors C1, C2 on the transmission lines T2, T4 can provide signal coupling and DC isolation effects. The capacitors C1, C2 may be non-polar capacitors having capacitance values of 33 nanofarad (nF) to 0.33 microfarad (μF). The transformer TR may have an inductance value of 150 microhenry (μH) to 400 μH, and provide impedance matching, lightning protection, common-mode filtering or the like functions within a specific frequency range (e.g., 1 MHz~125 MHz). Accordingly, by replacing a transmission circuit used in a traditional Ethernet device with the transmission circuit 13 shown in FIG. 1, the present invention can use a minimized number of components to provide signal coupling and DC isolation characteristics necessary for Ethernet transmission and provide the burst protection function.

Figure 2:
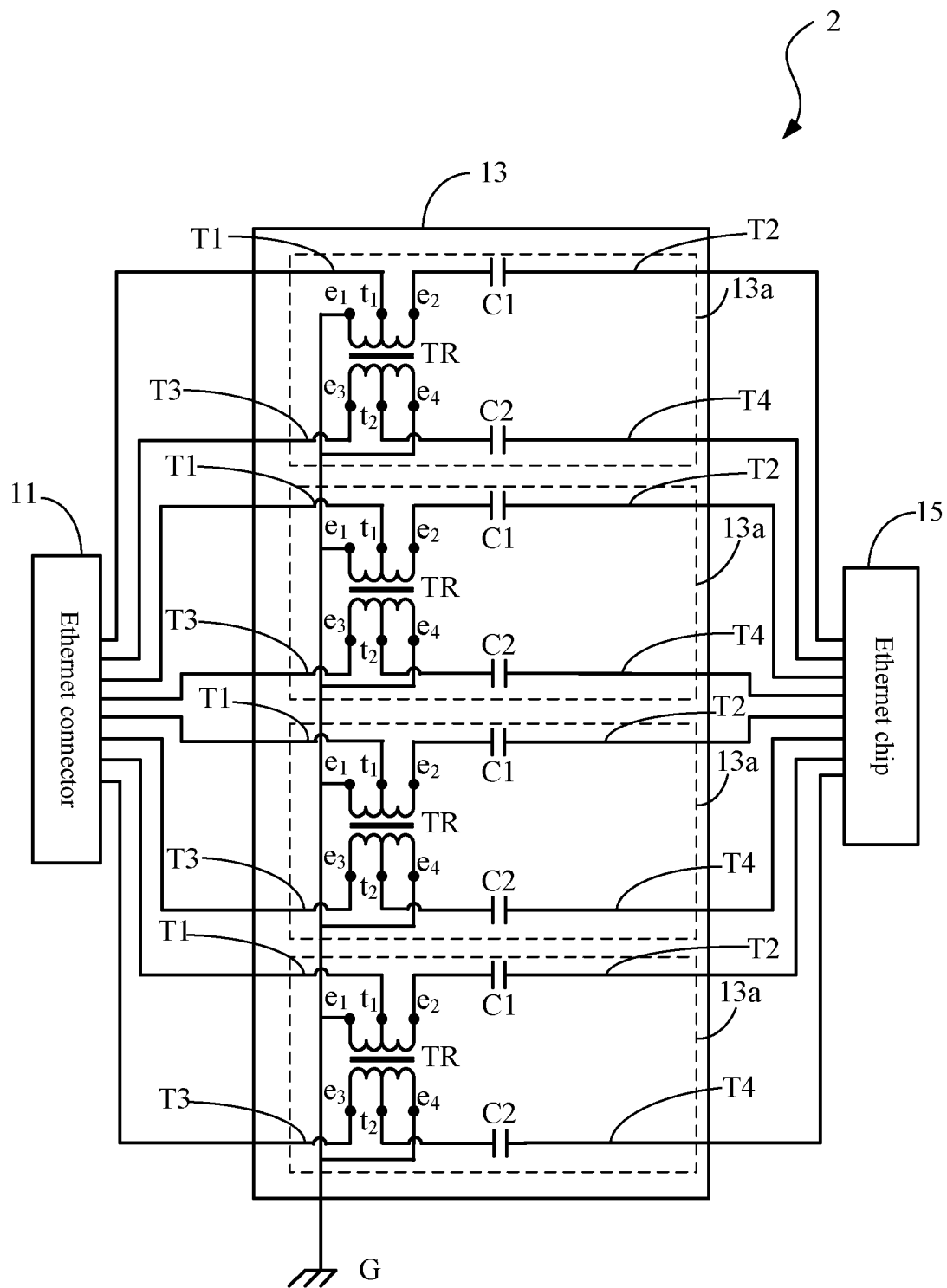
FIG. 2 is a schematic view of an Ethernet application circuit 2 according to a second embodiment of the present invention.

A second embodiment of the present invention is shown in FIG. 2, which is a schematic view of an Ethernet application circuit 2 according to the present invention. The transmission circuit 13 in the Ethernet application circuit 2 is a circuit equivalent to the transmission circuit 13 in the Ethernet application circuit 1.

Unlike the first embodiment, in the transmission circuit 13 of the present invention, two diagonal terminals $e_1$, e4 of the four terminals $e_1$, $e_2$, $e_3$, $e_4$ are coupled to the ground G. The other two diagonal terminals $e_3$, $e_2$ of the four terminals $e_1$, $e_2$, $e_3$, $e_4$ are coupled to the Ethernet connector 11 and, through the capacitor C1, to the Ethernet chip 15 via the transmission lines T3, T2 respectively. As shown in FIG. 2, the terminal $e_3$ is coupled to the Ethernet connector 11 via the transmission line T3, and the terminal $e_2$ is coupled to the Ethernet chip 15 via the capacitor C1 and through the transmission line T2.

The two center taps $t_1$, $t_2$ are coupled to the Ethernet connector 11 and, through the capacitor C2, to the Ethernet chip 15 via the transmission lines T1 and T4 respectively. As shown in FIG. 2, the center tap $t_1$ is coupled to the Ethernet connector 11 via the transmission line T1, and the center tap $t_2$ is coupled to the Ethernet chip 15 through the capacitor C2 and via the transmission line T4.

Similarly, the capacitors C1, C2 on the transmission lines T2, T4 can provide signal coupling and DC isolation effects. The transformer TR can provide impedance matching, lightning protection, common-mode filtering or the like functions within a specific frequency range. Accordingly, by replacing a transmission circuit used in a traditional Ethernet device with the transmission circuit 13 shown in FIG. 2, the present invention can use a minimized number of components to provide signal coupling and DC isolation characteristics necessary for Ethernet transmission and provide the burst protection function.

Figure 3A:
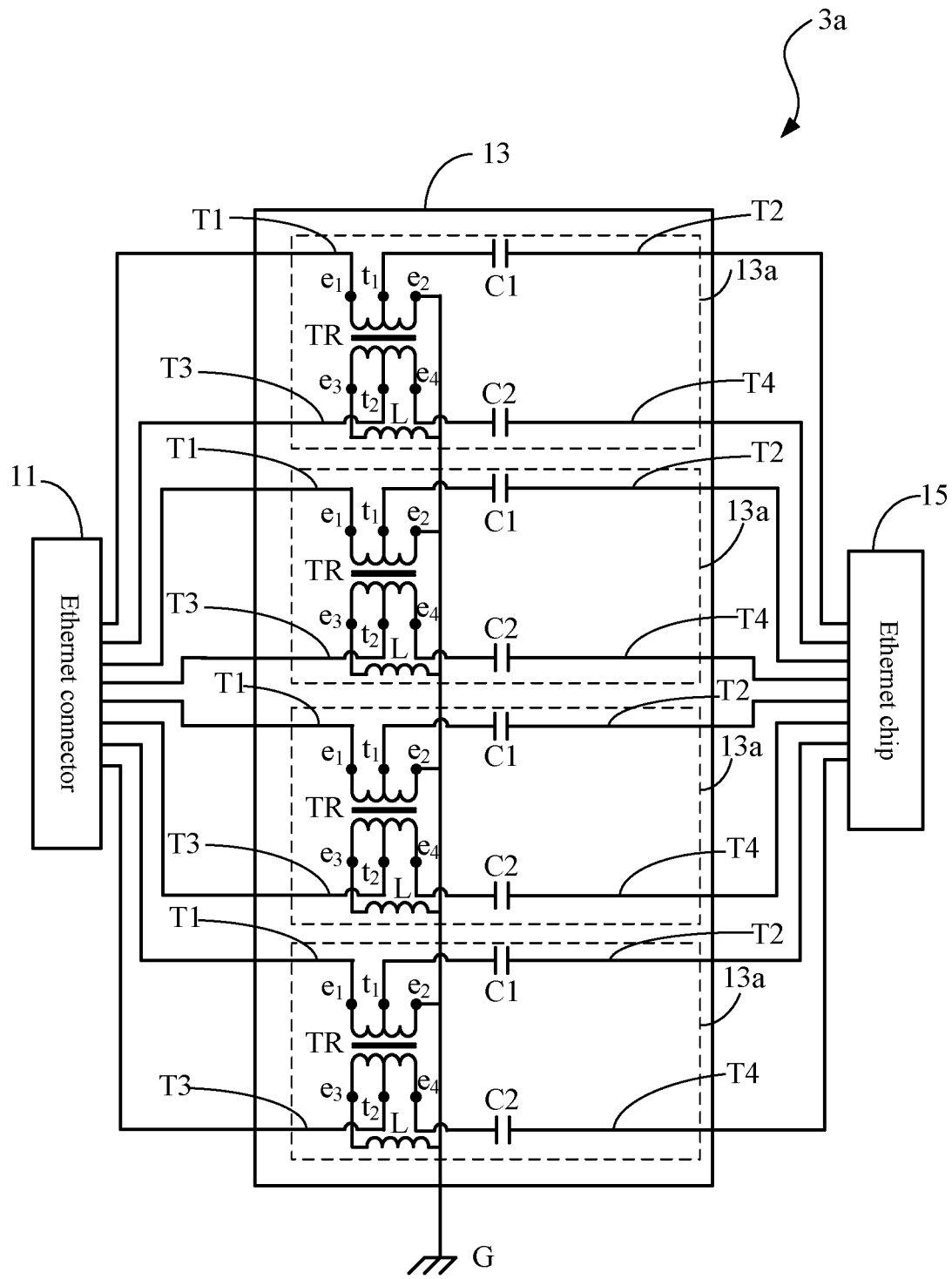
FIG. 3A and FIG. 3B are schematic views of an Ethernet application circuit 3a and an Ethernet application circuit 3b according to a third embodiment of the present invention respectively.
Figure 3B:
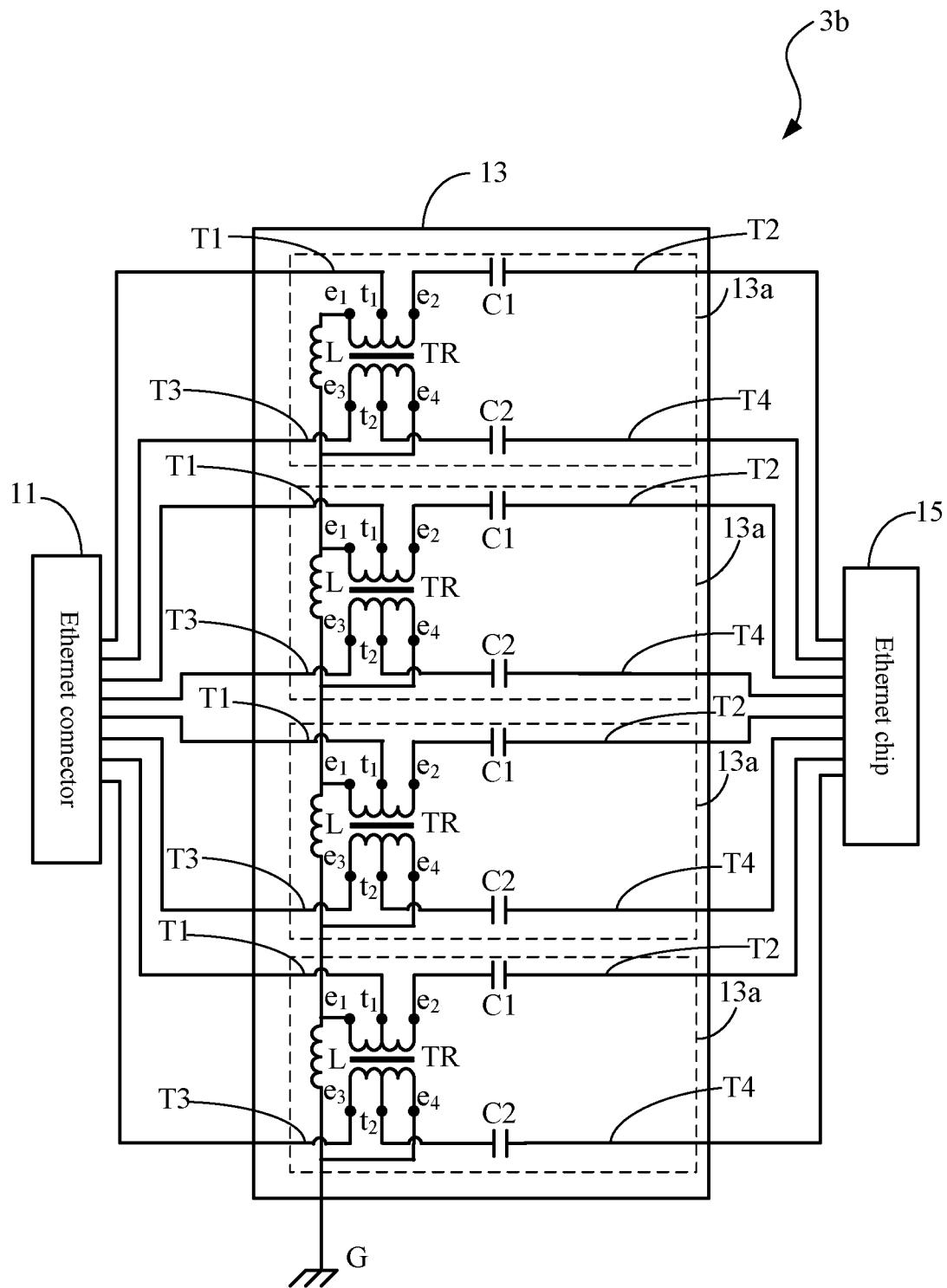

A third embodiment of the present invention is shown in FIGS. 3A and 3B, which are schematic views of Ethernet application circuits 3a, 3b according to the present invention respectively. In this embodiment, each transmission component set 13 further comprises an inductor L, and one of the two diagonal terminals coupled to the ground G is coupled to the ground G via the inductor L. The inductor L may have an inductance value of 1 μH to 100 μH.

The transmission circuit 13 in FIG. 3A is an extension of the transmission circuit 13 in FIG. 1. In FIG. 3A, the transmission component set 13a of the transmission circuit 13 further comprises an inductor L, and the terminal $e_3$ is coupled to the ground G further via the inductor L. Similarly, the transmission circuit 13 in FIG. 3B is an extension of the transmission circuit 13 in FIG. 2. In FIG. 3B, the transmission component set 13a of the transmission circuit 13 further comprises an inductor L, and the terminal $e_1$ is coupled to the ground G further via the inductor L.

It shall be appreciated that, by additionally disposing the inductor L to compensate for the possibly generated phase difference so that phases from each pair of signal lines to the ground G match each other as far as possible, the transmission circuit 13 of this embodiment further reduces the phase difference possibly caused by non-uniformity of paths from each pair of transmission lines to the ground G. The inductance value of the inductor L is determined based on a half of the single-side turn number of the transformer TR.

Figure 4A:
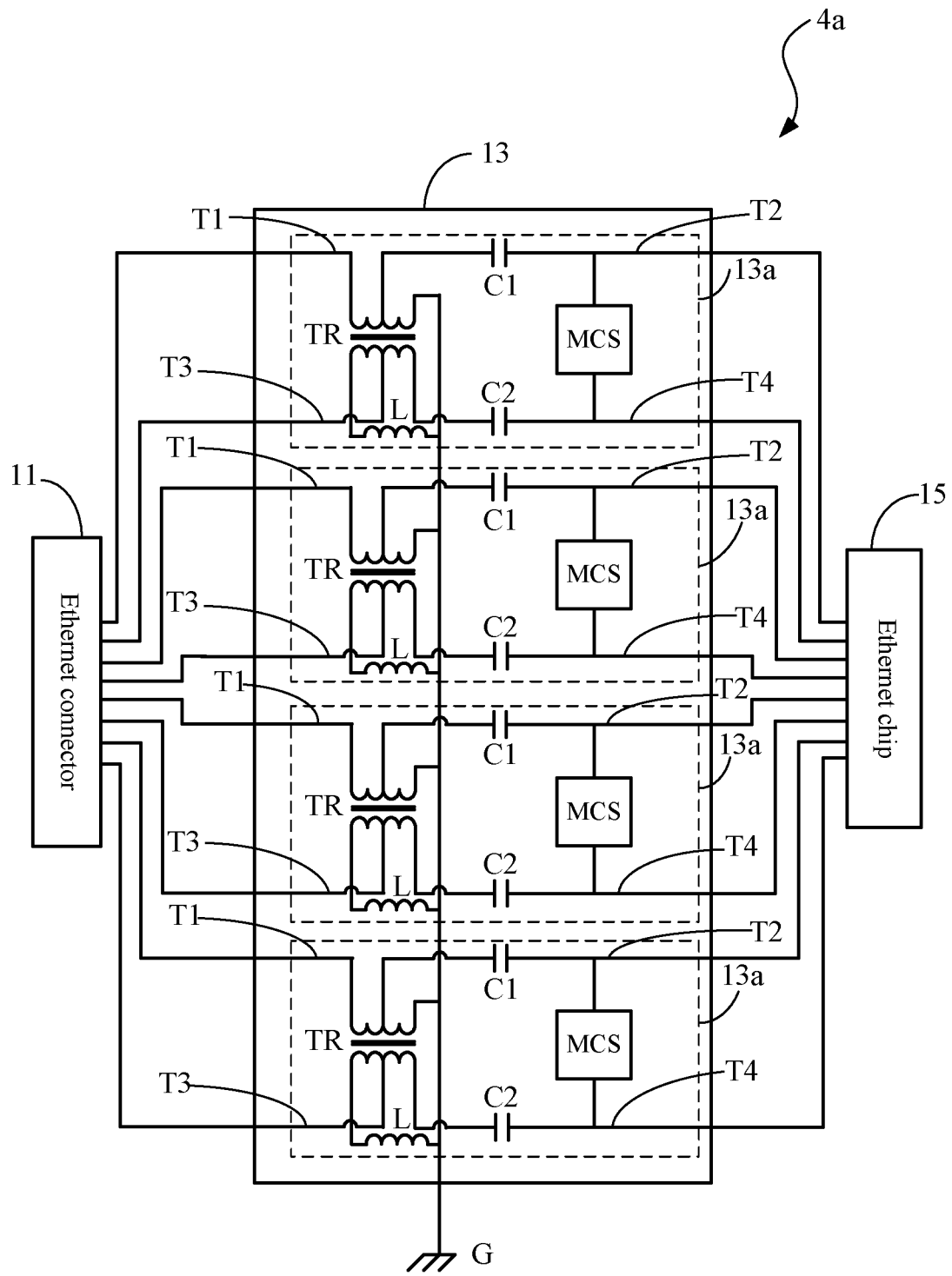
FIG. 4A and FIG. 4B are schematic views of an Ethernet application circuit 4a and an Ethernet application circuit 4b according to a fourth embodiment of the present invention respectively.
Figure 4B:
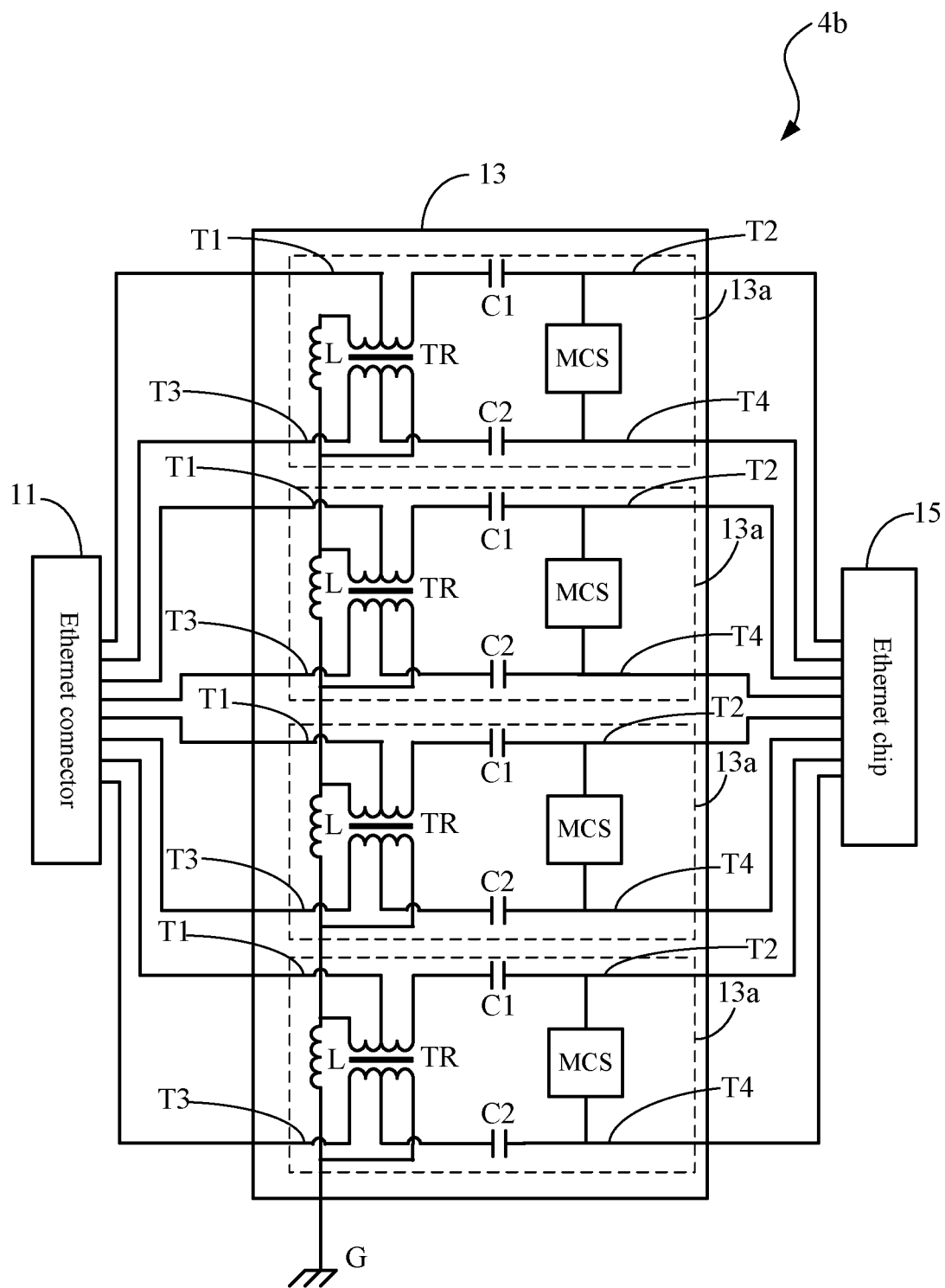

A fourth embodiment of the present invention is shown in FIGS. 4A and 4B, which are schematic views of Ethernet application circuits 4a, 4b of the present invention respectively. The transmission circuit 13 in FIGS. 4A and 4B are extensions of the transmission circuits 13 in FIGS. 3A and 3B. In this embodiment, each transmission component set 13a further comprises a matching component set MCS, which is coupled between two transmission lines T2, T4 that are arranged between the capacitors C1, C2 and the Ethernet chip 15. The matching component set MCS is used to adjust the impedance matching between the transmission circuit 13 and different network chips.

The matching component set MCS, which may be as shown in FIGS. 5A to 5E, provides the impedance circuit matching effect in the circuit by virtue of the capacitive character of components and provides a burst protection function by virtue of breakdown characteristics of the diode component. In FIGS. 5A to 5E, a contact P1 is coupled to the transmission line T2, a contact P2 is coupled to the transmission line T4, and a contact P3 is coupled to the ground G or a system ground (not shown). It shall be appreciated that, the ground G refers to a ground terminal of the device enclosure (i.e., an external ground terminal); however, the system ground refers to a common ground terminal (i.e., an internal ground terminal) which is usually at 0 volt.

Figure 5A:
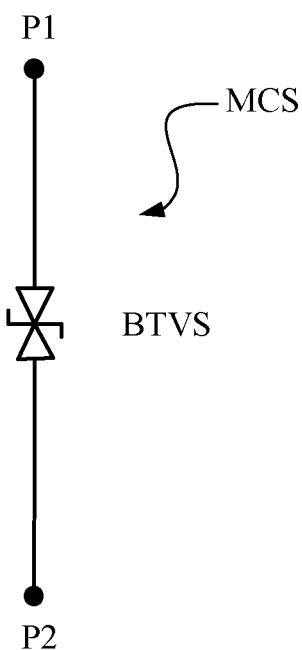
FIGS. 5A to 5E illustrate various aspects of a matching component set MCS according to the fourth embodiment of the present invention.
Figure 5B:
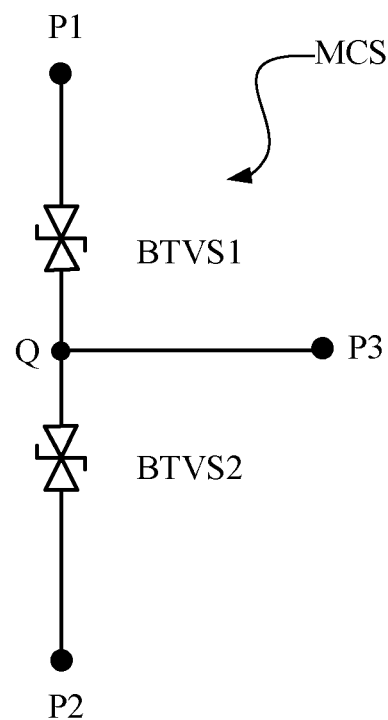

In FIG. 5A, the matching component set is a bidirectional transient voltage suppressor (TVS) diode BTVS. The bidirectional TVS diode BTVS may have a capacitance value of 0.35 picofarad (pF) to 6 pF. In FIG. 5B, the matching component set MCS comprises a combination of a first bidirectional TVS diode BTVS1 and a second bidirectional TVS diode BTVS2. The first bidirectional TVS diode BTVS1 and the second bidirectional TVS diode BTVS2 are coupled to each other in series and between the transmission lines T2 and T4, and a contact Q between the first bidirectional TVS diode BTVS1 and the second bidirectional TVS diode BTVS2 is coupled to the ground G or the system ground. The first bidirectional TVS diode BTVS1 and the second bidirectional TVS diode BTVS2 may have capacitance values of 1 pF to 10 pF.

Figure 5C:
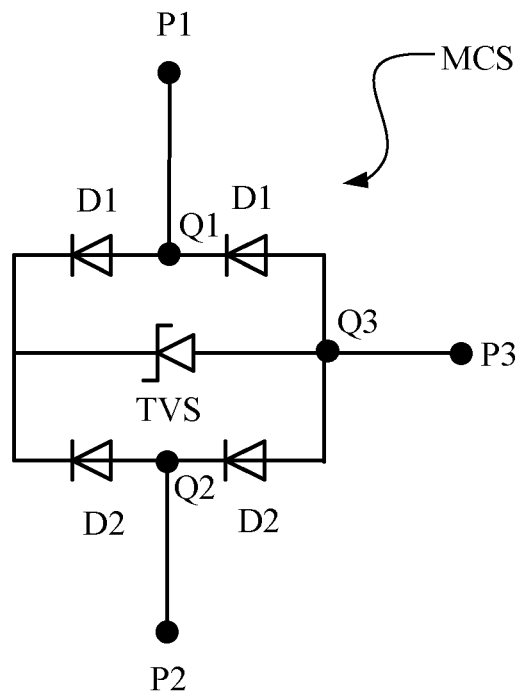

In FIG. 5C, the matching component set MCS comprises a first high-speed diode set, a second high-speed diode set and a unidirectional TVS diode. The unidirectional TVS diode may have a capacitance value of 1 pF to 10 pF. The matching component set MCS may be a single semiconductor packaged component, and consists of four low-capacitance diodes and one unidirectional TVS diode. Specifically, the first high-speed diode set comprises two high-speed diodes D1, which are coupled to each other in forward series and have a contact Q1 therebetween coupled to the second transmission line T2.

The second high-speed diode set comprises two high-speed diodes D2, which are coupled to each other in forward series and have a contact Q2 therebetween coupled to the fourth transmission lines T4. The unidirectional TVS diode TVS is coupled with the first high-speed diode set and the second high-speed diode set in forward parallel and has a contact Q3 coupled to the ground G or the system ground.

Figure 5D:
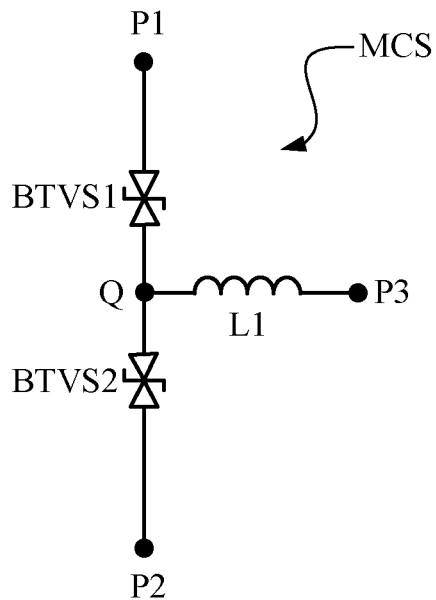

In FIG. 5D, the matching component set MCS comprises a first bidirectional TVS diode BTVS1, a second bidirectional TVS diode BTVS2 and a first inductor L1. The first bidirectional TVS diode BTVS1 and the second bidirectional TVS diode BTVS2 are coupled to each other in series and between the two transmission lines T2 and T4. A contact Q between the first bidirectional TVS diode BTVS1 and the second bidirectional TVS diode BTVS2 is coupled to the ground G or the system ground through the first inductor L1.

It shall be appreciated that, the matching component set MCS of FIG. 5D is an extension of the matching component set MCS of FIG. 5B, in which the first inductor L1 is additionally disposed to provide a common-mode filtering effect for handling common-mode noises of specific frequencies. The first bidirectional TVS diode BTVS1 and the second bidirectional TVS diode BTVS2 may have capacitance values of 1 pF to 10 pF. The first inductor L1 may have an inductance value of 10 µH to 50 µH.

Figure 5E:
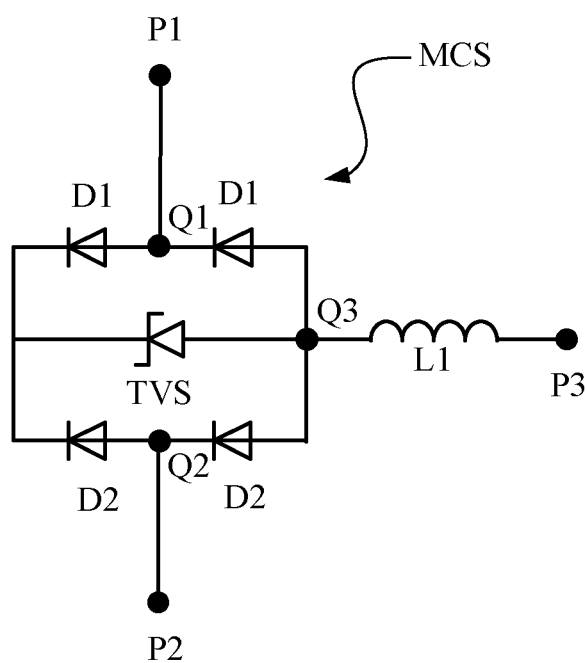

In FIG. 5E, the matching component set MCS comprises a first inductor L1, a first high-speed diode set, a second high-speed diode set and a unidirectional TVS diode TVS. The first high-speed diode set comprises two high-speed diodes D1, which are coupled to each other in forward series and have a contact Q1 therebetween coupled to the second transmission line T2. The second high-speed diode set comprises two high-speed diodes D2, which are coupled to each other in forward series and have a contact Q2 therebetween coupled to the fourth transmission line T4.

The unidirectional TVS diode TVS is coupled with the first high-speed diode set and the second high-speed diode set in forward parallel, and has a contact Q3 coupled to the ground G or the system ground through the first inductor L1. Similarly, the matching component set MCS of FIG. 5E is an extension of the matching component set MCS of FIG. 5C, in which the first inductor L1 is additionally disposed to provide a common-mode filtering effect for handling common-mode noises of specific frequencies. The unidirectional TVS diode TVS may have a capacitance value of 1 pF to 10 pF. The first inductor L1 may have an inductance value of 10 µH to 50 µH.

The matching component sets MCS shown in FIGS. 5A to 5E adopt appropriate capacitive components to achieve the matching effect, and adopt components having breakdown, clamping or switching characteristics to provide the network chip 15 with the additional burst protection function. It shall be appreciated that, as will be readily understood by those of ordinary skill in the art from the above descriptions, any components having the same functions as the matching component set MCS of the present invention can be applied to the transmission circuit 13 of the present invention, so any transmission circuit 13 obtained by simply replacing or modifying the matching component set MCS shall fall within the scope of the present invention.

On the other hand, the matching component set MCS of the present invention may also adopt a simple inactive component to achieve the matching effect, but not additionally provide the burst protection function, as shown in FIGS. 6A to 6F. In FIGS. 6A to 6F, the contact P1 is coupled to the second transmission line T2, the contact P2 is coupled to the fourth transmission line T4, and the contact P3 is coupled to the ground G or the system ground.

Figure 6A:
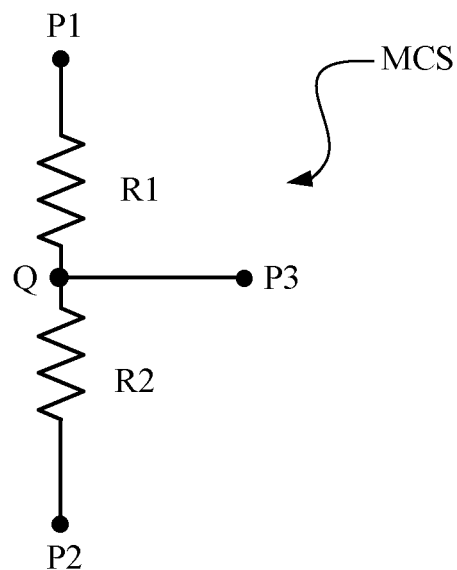
FIGS. 6A to 6F illustrate various aspects of a matching component set MCS according to the fourth embodiment of the present invention.
Figure 6B:
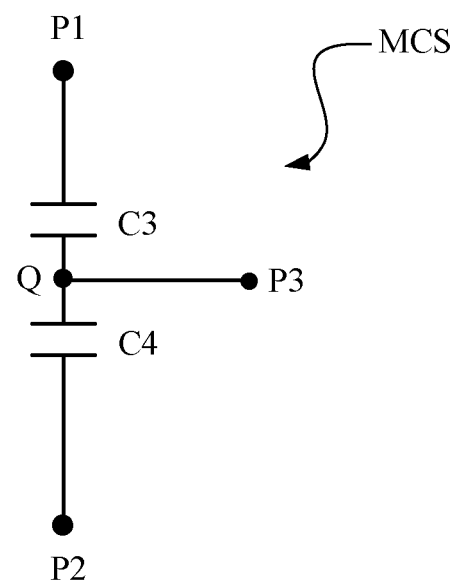

In FIG. 6A, the matching component set MCS comprises a first resistor R1 and a second resistor R2. The first resistor R1 and the second resistor R2 may have resistances of 1 kilo-ohm (kΩ) to 10 kΩ. A contact Q between the first resistor R1 and the second resistor R2 is coupled to the ground G or the system ground. In FIG. 6B, the matching component set MCS comprises a first capacitor C3 and a second capacitor C4. A contact Q between the first capacitor C3 and the second capacitor C4 is coupled to the ground G or the system ground. The first capacitor C3 and the second capacitor C4 may have capacitance values of 1 pF to 10 pF.

Figure 6C:
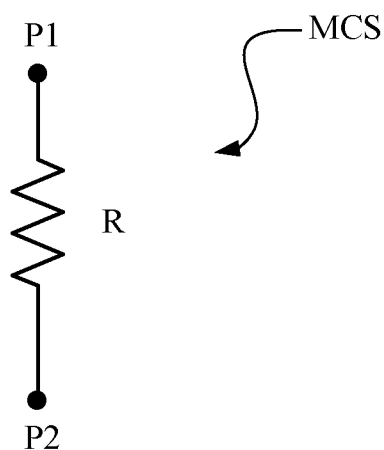
Figure 6D:
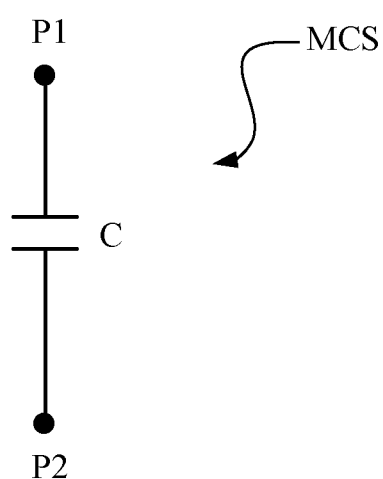

In FIG. 6C, the matching component set MCS is a resistor R coupled between the second transmission line T2 and the fourth transmission line T4. The resistor R may have a resistance value of 1 kΩ to 20 kΩ. In FIG. 6D, the matching component set MCS is a capacitor C coupled between the second transmission line T2 and the fourth transmission line T4. The capacitor C may have a capacitance value of 1 pF to 8 pF.

Figure 6E:
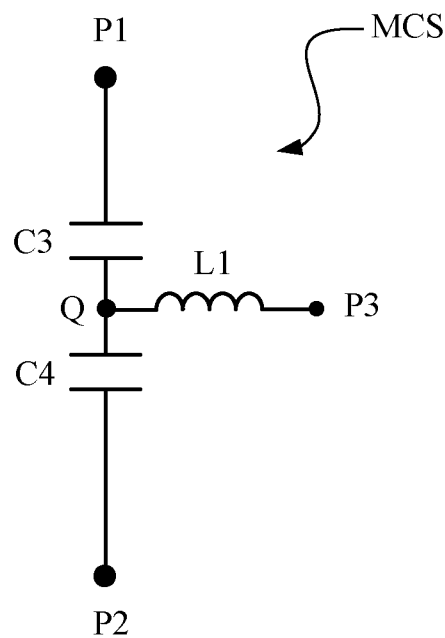

In FIG. 6E, the matching component set MCS comprises a first capacitor C3, a second capacitor C4 and a first inductor L1. The first capacitor C3 and the second capacitor C4 may have capacitance values of 1 pF to 10 pF. The first inductor L1 may have an inductance value of 10 µH to 50 µH. The first capacitor C3 and the second capacitor C4 are coupled to each other in series and between the second transmission line T2 and the fourth transmission line T4. A contact Q between the first capacitor C3 and the second capacitor C4 is coupled to the ground G or the system ground through the first inductor L1.

Figure 6F:
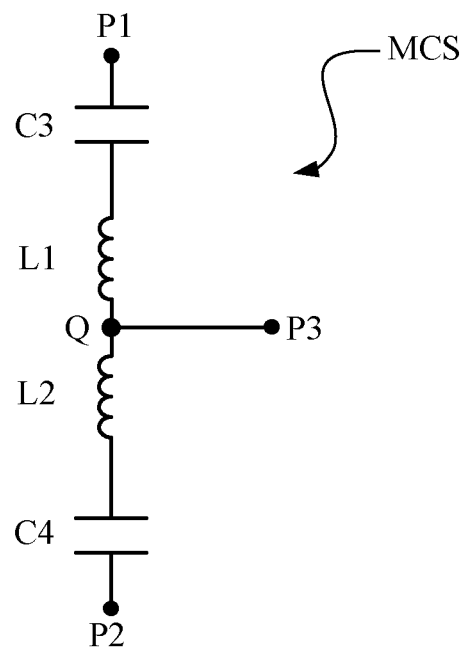

In FIG. 6F, the matching component set MCS comprises a first capacitor C3, a second capacitor C4, a first inductor L1 and a second inductor L2 that are connected in series. The first capacitor C3 is coupled to the second transmission line T2, and the second capacitor C4 is coupled to the fourth transmission line T4. The first inductor L1 and the second inductor L2 are coupled to each other in series and between the first capacitor C3 and the second capacitor C4. A contact Q between the first inductor L1 and the second inductor L2 is coupled to the ground G or the system ground. The first capacitor C3 and the second capacitor C4 may have capacitance values of 1 pF to 20 pF. The first inductor L1 and the second inductor L2 may have inductance values of 10 µH to 50 µH.

It shall be appreciated that, the inductor L in the third embodiment and the matching component set MCS in the fourth embodiment are components additionally provided in but not essential to the transmission circuit 13 of the present invention. In other words, in FIGS. 4A and 4B, the transmission circuit 13 of the present invention may also not comprise the inductor L for compensating for possibly generated phase differences.

According to the above descriptions, as compared with transmission circuits of traditional Ethernet devices, the transmission circuit of the present invention not only uses a smaller number of components, but can also provide signal coupling and DC isolation, impedance matching and common-mode noise filtering functions necessary for Ethernet transmission to improve the signal transmission performances and also provide the burst protection function. Thereby, the cost needed for producing the transmission circuit of the present invention is significantly lower than that of the transmission circuit of the traditional Ethernet device.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A transmission circuit for an Ethernet device, comprising:
    four transmission component sets, each of the transmission component sets being coupled between an Ethernet connector and an Ethernet chip;
    wherein:
        each of the transmission component sets comprises a transformer, two capacitors, and four transmission lines;
        the transformer of each of the transmission component sets comprises four terminals and two center taps;
        two diagonal terminals of the four terminals are coupled to a ground;
        the other two diagonal terminals of the four terminals are coupled to the Ethernet connector and, through one of the two capacitors, to the Ethernet chip via two of the four transmission lines, respectively; and
        the two center taps are coupled to the Ethernet connector and, through the other one of the two capacitors, the Ethernet chip via the other two of the four transmission lines, respectively.

2. The transmission circuit of claim 1, wherein each of the transmission component sets further comprises a matching component set and the matching component set is coupled between the two transmission lines which are coupled between the two capacitors and the Ethernet chip.

3. The transmission circuit of claim 1, wherein each of the transmission component sets further comprises an inductor, and one of the two diagonal terminals coupled to the ground is coupled to the ground through the inductor.

4. The transmission circuit of claim 3, wherein each of the transmission component sets further comprises a matching component set and the matching component set is coupled between the two transmission lines which are coupled between the two capacitors and the Ethernet chip.

5. The transmission circuit of claim 4, wherein the matching component set of each of the transmission component sets is a bidirectional transient voltage suppressor (TVS) diode.

6. The transmission circuit of claim 4, wherein the matching component set of each of the transmission component sets comprises a first bidirectional TVS diode and a second bidirectional TVS diode, the first bidirectional TVS diode and the second bidirectional TVS diode are coupled to each other in series and between the two transmission lines, and a contact between the first bidirectional TVS diode and the second bidirectional TVS diode is coupled to one of the ground and a system ground.

7. The transmission circuit of claim 4, wherein the matching component set of each of the transmission component sets comprises:
    a first high-speed diode set, including two high-speed diodes which are coupled to each other in forward series and have a contact therebetween coupled to one of the two transmission lines;
    a second high-speed diode set, including two high-speed diodes which are coupled to each other in forward series and have a contact therebetween coupled to the other one of the two transmission lines; and
    a unidirectional TVS diode, coupled with the first high-speed diode set and the second high-speed diode set in forward parallel and coupled to one of the ground and a system ground.

8. The transmission circuit of claim 4, wherein the matching component set of each of the transmission component sets comprises a first bidirectional TVS diode, a second bidirectional TVS diode and a first inductor, the first bidirectional TVS diode and the second bidirectional TVS diode are coupled to each other in series and between the two transmission lines, and a contact between the first bidirectional TVS diode and the second bidirectional TVS diode is coupled to one of the ground and a system ground through the first inductor.

9. The transmission circuit of claim 4, wherein the matching component set of each of the transmission component sets comprises:
    a first inductor;
    a first high-speed diode set, having two high-speed diodes which are coupled to each other in forward series and have a contact therebetween coupled to one of the two transmission lines;
    a second high-speed diode set, including two high-speed diodes which are coupled to each other in forward series and has a contact therebetween coupled to the other one of the two transmission lines; and
    a unidirectional TVS diode, coupled with the first high-speed diode set and the second high-speed diode set in forward parallel, and coupled to one of the ground and a system ground through the first inductor.

10. The transmission circuit of claim 4, wherein the matching component set of each of the transmission component sets comprises a first resistor and a second resistor, the first resistor and the second resistor are coupled to each other in series and between the two transmission lines, and a contact between the first resistor and the second resistor is coupled to one of the ground and a system ground.

11. The transmission circuit of claim 4, wherein the matching component set of each of the transmission component sets comprises a first capacitor and a second capacitor, the first capacitor and the second capacitor are coupled to each other in series and between the two transmission lines, and a contact between the first capacitor and the second capacitor is coupled to one of the ground and a system ground.

12. The transmission circuit of claim 4, wherein the matching component set of each of the transmission component sets is one of a resistor and a capacitor.

13. The transmission circuit of claim 4, wherein the matching component set of each of the transmission component sets comprises a first capacitor, a second capacitor and a first inductor, the first capacitor and the second capacitor are coupled to each other in series and between the two transmission lines, and a contact between the first capacitor and the second capacitor is coupled to one of the ground and a system ground via the first inductor.

14. The transmission circuit of claim 4, wherein the matching component set of each of the transmission component sets comprises a first capacitor, a second capacitor, a first inductor and a second inductor; the first capacitor is coupled to one of the two transmission lines, the second capacitor is coupled to the other one of the two transmission lines, the first inductor and the second inductor are coupled to each other in series and between the first capacitor and the second capacitor, and a contact between the first inductor and the second inductor is coupled to one of the ground and a system ground.

* * * * *